(12) United States Patent
Hu

(10) Patent No.: US 7,843,445 B2
(45) Date of Patent: Nov. 30, 2010

(54) PORTABLE ELECTRONIC DEVICE

(75) Inventor: Li-Qing Hu, Foshan (CN)

(73) Assignees: Premier Image Technology(China) Ltd., Foshan, Guangdong Province (CN); Hon Hai Precision Industry Co., Ltd., Tu-Cheng, Taipei Hsien (TW)

(*) Notice: Subject to any disclaimer, the term of this patent is extended or adjusted under 35 U.S.C. 154(b) by 707 days.

(21) Appl. No.: 11/871,921

(22) Filed: Oct. 12, 2007

(65) Prior Publication Data

US 2008/0246469 A1 Oct. 9, 2008

(30) Foreign Application Priority Data

Apr. 5, 2007 (CN) .................... 2007 1 0200396

(51) Int. Cl.
*G09G 5/00* (2006.01)
(52) U.S. Cl. ........................ 345/204; 345/156
(58) Field of Classification Search ........... 345/204, 345/156, 30, 108, 110, 111
See application file for complete search history.

(56) References Cited

U.S. PATENT DOCUMENTS

| 7,288,934 B1 * | 10/2007 | Ikarashi et al. ......... 324/207.21 |
| 2003/0203747 A1 | 10/2003 | Nagamine |
| 2004/0203532 A1 | 10/2004 | Mizuta |

* cited by examiner

*Primary Examiner*—Ricardo L Osorio
(74) *Attorney, Agent, or Firm*—Jeffrey T. Knapp

(57) ABSTRACT

A portable electronic device includes a body, a flippable unit, a pivoting shaft, a first magnetizable element, a second magnetizable element, a magnetic induction sensor IC, and a magnet. The pivot shaft connects the body and the flippable unit. A display is disposed in the flippable unit for showing an image. The magnetic induction sensor IC is disposed in the body. The magnet is disposed at and rotatable with the pivoting shaft. The first and the second magnetizable elements are disposed between the magnet and the magnetic induction sensor IC to enlarge the magnetic field of the magnet such that the magnetic induction sensor IC is capable of detecting change of the magnetic field of the magnet when the flippable unit together with the magnet is pivoted relative to the body.

17 Claims, 3 Drawing Sheets

PORTABLE ELECTRONIC DEVICE

TECHNICAL FIELD

The present invention relates to portable electronic devices for image acquisition and, particularly, to a portable electronic device having a flippable display.

BACKGROUND

Many portable electronic devices like digital cameras, include a flippable display on the body of the portable devices having a self-timer for taking pictures. A user of the digital camera can flip the flippable display toward himself for taking self-portraits. Generally, a pivoting shaft is employed to connect the flippable display with the digital device. By utilizing the pivoting shaft, the flippable display is rotatable through various angles to a desired position.

It is desirable that the portable device keep the display image at an upright orientation as viewed by the user, no matter how the flippable display has been rotated. A flip mechanism employed in a typical portable device is shown in FIG. 1. A flippable display 10 is connected to the body 14 by a pivoting shaft 15. The body 14 includes a housing 141, a Hall sensor IC 12 received inside the housing 141, and a permanent magnet 11 disposed inside the flippable display 10. When the flippable display 10 is rotated, the permanent magnet 11 moves simultaneously with the flippable display 10 and induces the Hall sensor IC 12 to create a magnetic signal. The magnetic signal is sent to a digital signal processor 16 of the portable device for further calculation to determine whether or not to reorient the image shown on the display. Accordingly, no matter how the flippable display is rotated, the image shown on the flippable display 10 can be automatically maintained at an upright orientation.

However, because the permanent magnet 11 is located away from the Hall sensor IC 12, induction therebetween might fail if the flippable display 10 is rotated beyond a certain degree. The image shown in the flippable display 10 may not be oriented correctly. To solve this problem, it is pretty common to enlarge the size of the permanent magnet 11 to enhance induction with the Hall sensor IC 12. As a result, the flippable display 10 has to be increased in size accordingly to receive the permanent magnet 11. However, it is against development in portable electronic device technology to enlarge any part thereof. Therefore, it is necessary to provide a portable electronic device with a flippable display in a compact volume.

SUMMARY

In accordance with a present embodiment, a portable electronic device is disclosed. The portable electronic device includes a body, a flippable unit, a pivoting shaft, a first magnetizable element, a second magnetizable element, a magnetic induction sensor IC, and a magnet. The pivot shaft connects the body and the flippable unit. A display is disposed in the flippable unit for showing an image. The first magnetizable element is disposed in the body and the second magnetizable element is disposed in the pivoting shaft. The magnet and the first and second magnetizable elements are aligned to create a magnetic field within reliable sensing distance of the magnetic induction sensor IC. Fluctuations in the magnetic field generated when the flippable unit together with the magnet is rotated relative to body, cause a signal to be produced by the magnetic induction sensor IC, which then transmits the signal to the digital signal processor. The image shown on the display is maintained in a desired orientation according to a determination of the digital signal processor after processing the signal.

Other advantages and novel features will be drawn from the following detailed description of present embodiments in conjunction with the attached drawings.

BRIEF DESCRIPTION OF THE DRAWINGS

Many aspects of the present portable electronic device can be better understood with reference to the following drawings. The components in the drawings are not necessarily drawn to scale, the emphasis instead being placed upon clearly illustrating the principles of the present zoom lens module. Moreover, in the drawings, like reference numerals designate corresponding parts throughout the several views.

DETAILED DESCRIPTION OF THE PREFERRED EMBODIMENT

Embodiments of the present portable electronic device will now be described in detail below and with reference to the drawings.

When a magnetizable element is brought near to a permanent magnet, that if it wasn't magnetized before it will become magnetized and the magnetic field of the permanent magnet will combine with that of the element to form a single expanded field in the surrounding space. In this way it is possible to create an elongated magnetic field without having to use a larger magnet simply by positioning one or more magnetizable elements near a smaller permanent magnet. In the below described embodiment a plurality of magnetizable elements are placed in alignment in the intervening distance between a permanent magnet and a sensor, thereby creating a continuous magnetic field spanning from the permanent magnet to the sensor.

Figure 1:
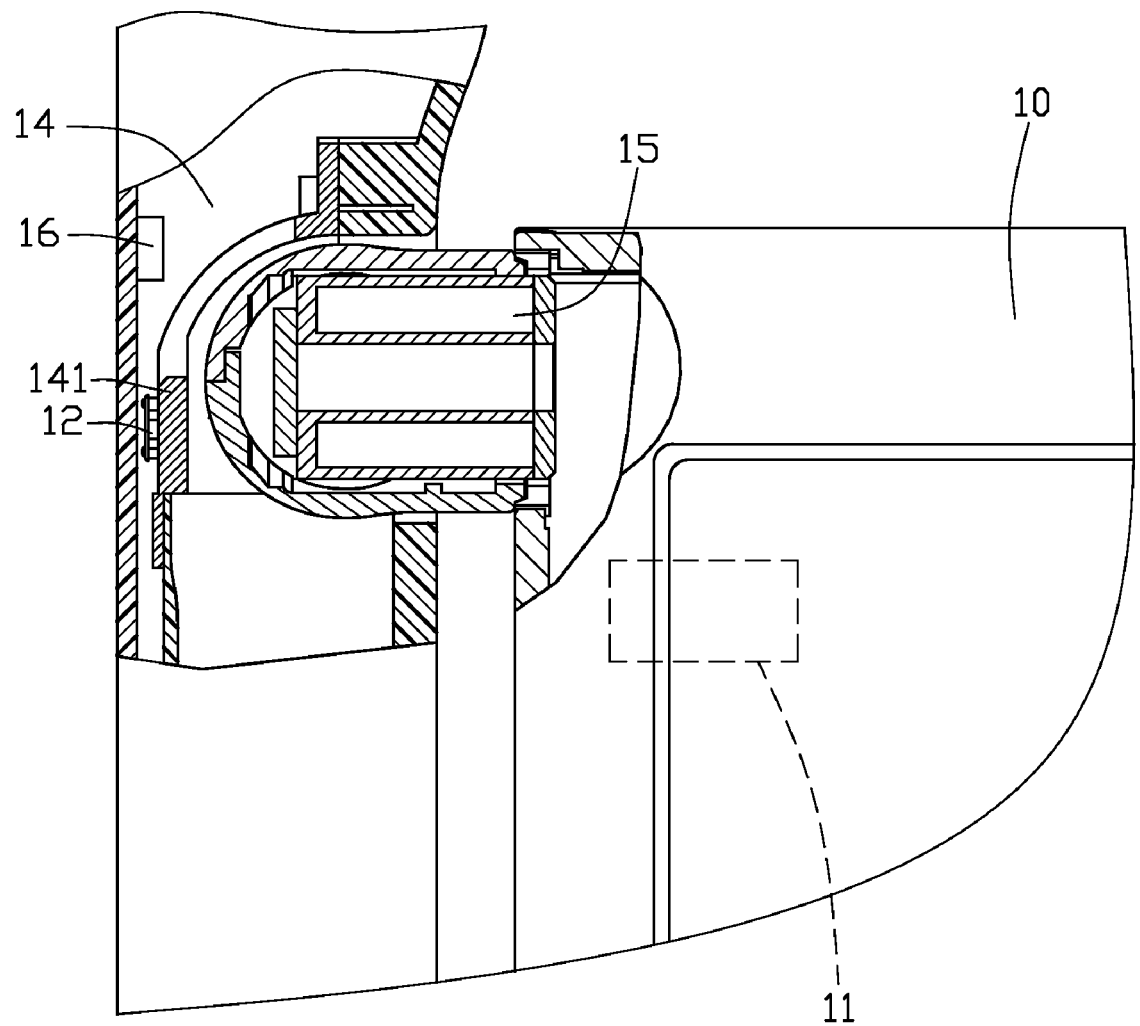
FIG. 1 is a cut-away view of a portable electronic device capable of maintaining the image shown on a flippable display at an upright orientation when the flippable display is rotated according to a related art.
Figure 2:
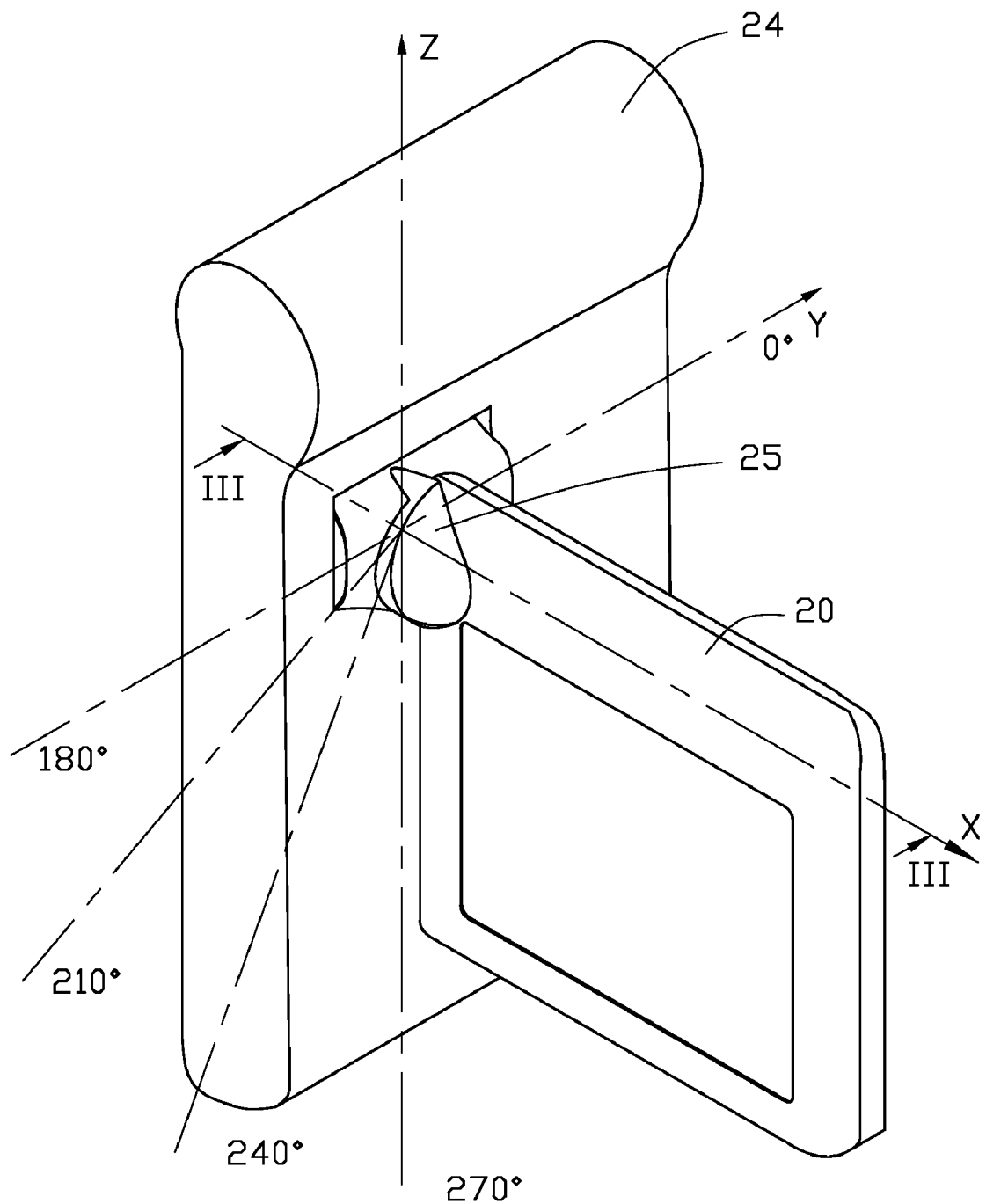
FIG. 2 is an isometric view of a portable electronic device having a flippable display according to a present embodiment.

FIG. 2 illustrates a portable electronic device, for example, a digital video recorder in accordance with a present embodiment. The digital video recorder includes a body 24, a flippable unit 20 having a display, a pivoting shaft 25 connecting the body 24, and the flippable unit 20. By utilizing the pivoting shaft 25, the flippable unit 20 is rotatable about the X-axis and the image shown on the display can be maintained in a desired orientation. As an example, a detail description is disclosed in which the flappable unit 20 is rotated from 0 to 270 degrees.

Figure 3:
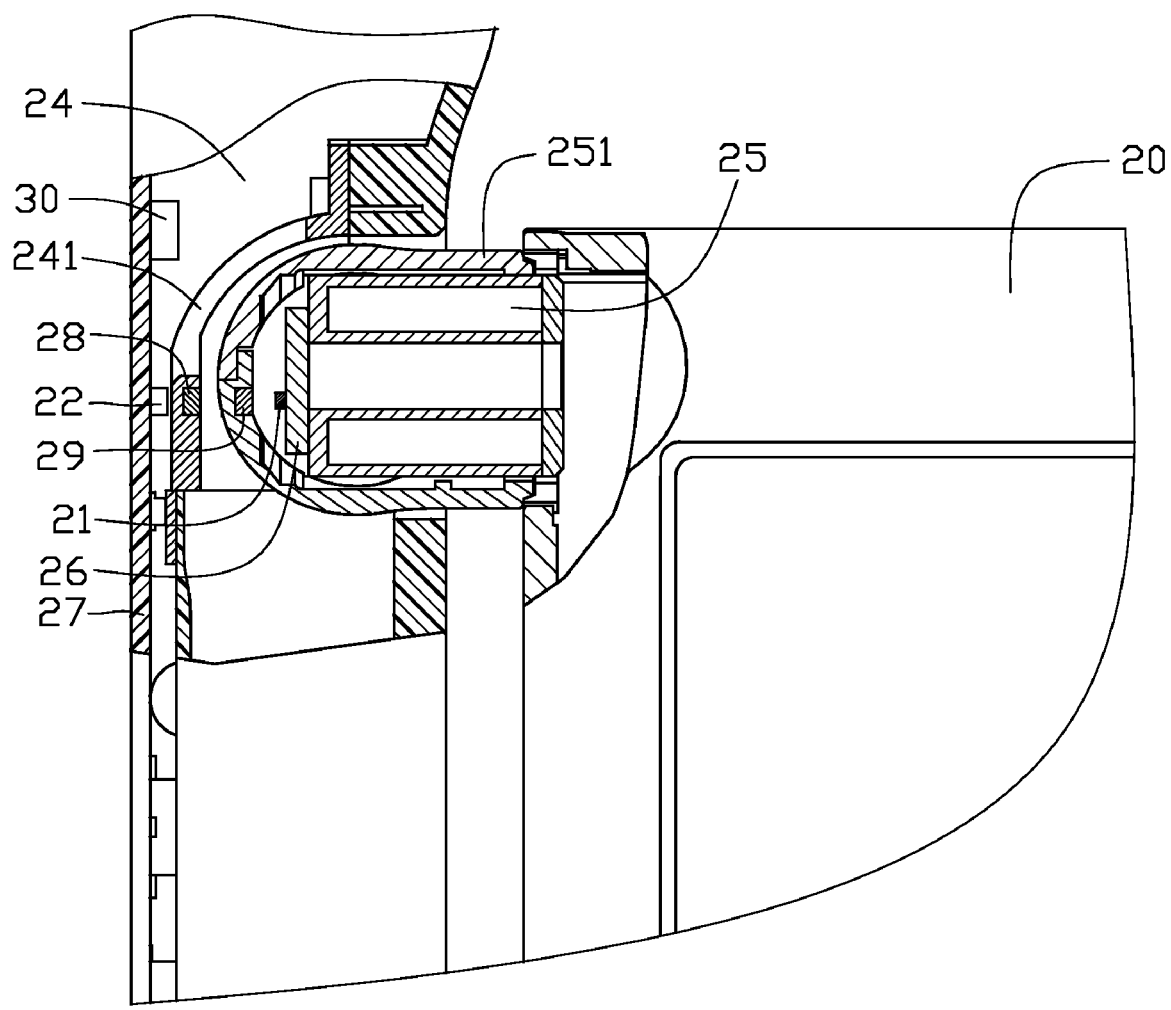
FIG. 3 is a cut-away view of the portable electronic device of FIG. 2 along a pivoting shaft section thereof, according to the present embodiment.

Referring to FIG. 3, a cut-away view of the portable electronic device of FIG. 2 in the pivoting shaft section is disclosed. The body 24 of the digital video recorder includes a housing 241 and a printed circuit board (PCB) 27 received inside the housing 241. A digital signal processor 30 and a magnetic induction sensor IC such as a Hall sensor IC 22 are electrically connected to the PCB 27. The body 24 further includes at least one first magnetizable element 28. The first magnetizable element 28 is attached to the housing 241 and disposed opposite and adjacent to the Hall sensor IC 22. The flippable unit 20 is equipped with a display and is connected to the body 24 by the pivoting shaft 25. The pivoting shaft 25 includes a cover 251 and a magnet 21 disposed on a distal end 26 of the pivoting shaft 25 away from the flippable unit 20, to be simultaneously rotatable with the pivoting shaft 25. The pivoting shaft 25 further includes at least one second magnetizable element 29 attached inside the cover 251 and disposed opposite to the magnet 21. In the present embodiment, the magnet 21 is a permanent magnet. The first and the second magnetizable elements 28, 29, the magnet 21, and the Hall sensor IC 22 are arranged in a line to maximize density of the single magnetic field linking the magnet 21 to the sensor 22.

In the present embodiment, the flippable unit 20 is initially folded against the body 24. When a user pivots the flippable unit 20 open, the display is facing down and should be rotated up 90 degrees to face the user. At this time any image on the display should appear upright to the user. When the user wishes to appear in the field of view of the digital video camera and still be able to view the display, the user will continue rotation of the flippable unit 20 to a point approximately 270 degrees from the initial open position, at which point the display faces away from the user side of the digital video recorder. The rotation of the flippable unit 20 will cause the magnetic field to fluctuate in a manner that is sensed by the sensor 22. The sensor 22 then transmits the signal to the digital signal processor 30. The digital signal processor 30 processes the signal accordingly and determines whether or not to reorient the image on the display of the flippable unit 20. In this embodiment, when the display is rotated beyond 180 degrees from the initial open position the image will be reoriented to appear upright from a user's point of view from the object side of the digital video recorder.

In other embodiments the amounts of magnetizable elements utilized may be adjusted according to need.

The embodiments of the present portable device utilize the first and the second magnetizable elements 28, 29 to reliably enlarge the magnetic field to be more easily sensed by the Hall sensor 22. Accordingly, the components making up the magnetic field can be small and distributed in a manner to help minimize the size of the portable device.

It will be understood that the above particular embodiments and methods are shown and described by way of illustration only. The principles and features of the present invention may be employed in various and numerous embodiments thereof without departing from the scope of the invention as claimed. The above-described embodiments illustrate the scope of the invention but do not restrict the scope of the invention.

What is claimed is:

1. A portable electronic device comprising:
a body;
a flippable unit having a display;
a pivoting shaft connecting the body with the flippable unit;
a cover attached around an end portion of the pivoting shaft away from the flippable unit;
a first magnetizable element disposed in the cover;
a second magnetizable element disposed in the body;
a magnetic induction sensor IC disposed in the body; and
a magnet disposed at and rotatable with the pivoting shaft;
wherein the first magnetizable element and the second magnetizable element are disposed between the magnet and the magnetic induction sensor IC to enlarge the magnetic field of the magnet such that the magnetic induction sensor IC is capable of detecting change of the magnetic field of the magnet when the flippable unit together with the magnet is pivoted relative to the body.

2. The portable electronic device as claimed in claim 1, further comprising a digital signal processor, wherein the digital signal processor is electrically coupled to the magnetic induction sensor IC configured to receive a signal from the magnetic induction sensor IC to determine whether or not to reorient an image shown on the display of the flippable unit, the signal corresponding to the rotation degree of the flippable unit relative to the body.

3. The portable electronic device as claimed in claim 2, wherein an image shown on the display is maintained at an upright orientation from the perspective of a user according to a determination of the digital signal processor after processing the signal.

4. The portable electronic device as claimed in claim 1, wherein the body comprises a housing and the second magnetizable element is attached inside the housing.

5. The portable electronic device as claimed in claim 1, wherein one of the first magnetizable element and the second magnetizable element is disposed opposite to the magnetic induction sensor IC.

6. The portable electronic device as claimed in claim 5, wherein the other one of the first magnetizable element and the second magnetizable element is disposed opposite to the magnet.

7. The portable electronic device as claimed in claim 1, wherein the magnet, the first magnetizable element, and the second magnetizable element are arranged in a line.

8. The portable electronic device as claimed in claim 1, wherein the magnetic induction sensor IC is a Hall sensor IC.

9. The portable electronic device as claimed in claim 1, wherein one of the first magnetizable element and the second magnetizable element is composed of iron.

10. The portable electronic device as claimed in claim 1, wherein the magnet is a permanent magnet.

11. The portable electronic device as claimed in claim 1, wherein the display is a liquid crystal display.

12. A portable electronic device comprising:
a body;
a flippable unit having a display;
a pivoting shaft pivotably connecting the flippable unit with the body;
a magnet disposed at and rotatable with the pivoting shaft;
a magnetic induction sensor IC disposed in the body;
a magnetizable element disposed between the magnet and the magnetic induction sensor IC configured to expand magnetic field of the magnet to the magnetic induction sensor IC such that the magnetic induction sensor IC is capable of detecting change of the magnetic field of the magnet when the flippable unit together with the shaft and the magnet is pivoted relative to the body and generating a signal in response to the rotation degree of the flippable unit relative to the body; and
a signal processor electrically coupled to the magnetic induction sensor IC configured to receive the signal from the magnetic induction sensor IC to determine whether or not to reorient an image shown on the display of the flippable unit.

13. The portable electronic device as claimed in claim 12, wherein the magnet, the magnetic induction sensor IC, and the magnetizable element are arranged in one line.

14. The portable electronic device as claimed in claim 13, further comprising a cover and another magnetizable element, wherein an end portion of the pivoting shaft away from the flippable unit is received in the cover, the magnet is disposed at the end portion of the pivoting shaft, and the another magnetizable element is disposed at the cover in said line.

15. The portable electronic device as claimed in claim 14 being a digital camera, wherein the signal processor is a digital signal processor.

16. The portable electronic device as claimed in claim 14, wherein the magnet is a permanent magnet, and the magnetizable element and the another magnetizable element are composed of irons.

17. The portable electronic device as claimed in claim 14, wherein the magnetizable element is disposed opposite to the magnetic induction sensor IC and the another magnetizable element is disposed opposite to the magnet.

* * * * *